(12) United States Patent
Nomura et al.

(10) Patent No.: US 11,309,259 B2
(45) Date of Patent: Apr. 19, 2022

(54) HIGH FREQUENCY MODULE

(71) Applicant: Murata Manufacturing Co., Ltd., Kyoto (JP)

(72) Inventors: Tadashi Nomura, Kyoto (JP); Takafumi Kusuyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 51 days.

(21) Appl. No.: 17/077,125

(22) Filed: Oct. 22, 2020

(65) Prior Publication Data

US 2021/0043585 A1    Feb. 11, 2021

Related U.S. Application Data

(63) Continuation of application No. PCT/JP2019/018207, filed on May 7, 2019.

(30) Foreign Application Priority Data

May 8, 2018    (JP) .............................. JP2018-089657

(51) Int. Cl.
| | |
|---|---|
| *H01L 23/552* | (2006.01) |
| *H01L 23/00* | (2006.01) |
| *H01L 21/48* | (2006.01) |
| *H01L 21/56* | (2006.01) |
| *H01L 23/31* | (2006.01) |

(Continued)

(52) U.S. Cl.
CPC ........ *H01L 23/562* (2013.01); *H01L 21/4853* (2013.01); *H01L 21/565* (2013.01);
(Continued)

(58) Field of Classification Search
CPC combination set(s) only.
See application file for complete search history.

(56) References Cited

U.S. PATENT DOCUMENTS

| 5,536,584 A | 7/1996 | Sotokawa et al. |
|---|---|---|
| 10,973,132 B2 * | 4/2021 | Chikita ............... H01L 23/5389 |

(Continued)

FOREIGN PATENT DOCUMENTS

| JP | H05-275417 A | 10/1993 |
|---|---|---|
| JP | 2005-203633 A | 7/2005 |

(Continued)

OTHER PUBLICATIONS

International Search Report issued in Application No. PCT/JP2019/018207, dated Jul. 30, 2019.

(Continued)

*Primary Examiner* — Niki H Nguyen
(74) *Attorney, Agent, or Firm* — Pearne & Gordon LLP

(57) ABSTRACT

A high frequency module in which warpage does not easily occur is provided by adjusting linear expansion coefficient, glass transition temperature, and elastic modulus of a sealing resin layer. The high frequency module includes a wiring board, a first component mounted on a lower surface of the wiring board, a plurality of connection terminals, a first sealing resin layer that coats the first component and the connection terminal, a plurality of second components mounted on an upper surface of the wiring board, a second sealing resin layer coating the second components, and a shield film. The first sealing resin layer is formed thinner than the second sealing resin layer, and the first sealing resin layer has the linear expansion coefficient of the resin smaller than the linear expansion coefficient of the resin of the second sealing resin layer.

13 Claims, 7 Drawing Sheets

(51) Int. Cl.
*H01L 23/498* (2006.01)
*H01L 23/66* (2006.01)

(52) U.S. Cl.
CPC .... *H01L 23/3128* (2013.01); *H01L 23/49816* (2013.01); *H01L 23/49838* (2013.01); *H01L 23/552* (2013.01); *H01L 23/66* (2013.01); *H01L 24/08* (2013.01); *H01L 2224/16227* (2013.01); *H01L 2924/19106* (2013.01); *H01L 2924/3025* (2013.01); *H01L 2924/3511* (2013.01)

(56) References Cited

U.S. PATENT DOCUMENTS 11,201,633 B2 * 12/2021 Watanabe ............... H01L 23/12
2014/0185256 A1 * 7/2014 Ogawa .................. H01L 23/552 361/760
2015/0179621 A1 * 6/2015 Matsumoto ....... H01L 23/49811 257/737
2019/0028083 A1 * 1/2019 Yasuda ................. H01L 25/165

FOREIGN PATENT DOCUMENTS

| | | |
|---|---|---|
| JP | 2010-118649 A | 5/2010 |
| WO | 2013/035715 A1 | 3/2013 |
| WO | 2014/017159 A1 | 1/2014 |

OTHER PUBLICATIONS

Written Opinion issued in Application No. PCT/JP2019/018207, dated Jul. 30, 2019.

* cited by examiner

STRAIN-TEMPERATURE CHARACTERISTICS

ELASTIC MODULUS-TEMPERATURE CHARACTERISTICS

HIGH FREQUENCY MODULE

CROSS REFERENCE TO RELATED APPLICATIONS

This is a continuation of International Application No. PCT/JP2019/018207 filed on May 7, 2019 which claims priority from Japanese Patent Application No. 2018-089657 filed on May 8, 2018. The contents of these applications are incorporated herein by reference in their entireties.

BACKGROUND OF THE DISCLOSURE

Field of the Disclosure

The present disclosure relates to a high frequency module in which components are mounted on one main surface of a wiring board and the components are coated with a sealing resin layer.

Description of the Related Art

Conventionally, there is proposed a high frequency module, as in a module 100 shown in FIG. 10, in which a plurality of chip components 102 coated with a second resin layer 103 are mounted on an upper surface 101a of a wiring board 101, and a semiconductor substrate 104 and connection terminals 105 coated with a first resin layer 106 are mounted on a lower surface 101b of the wiring board 101. In the above module 100, a surface 106a of the first resin layer 106 may be ground to expose the semiconductor substrate 104 and the connection terminals 105 from the first resin layer 106. This can reduce the thickness of one sealing resin layer and achieve the module 100 to be reduced in height.

In this way, when the thickness of one resin layer is smaller than the thickness of the other resin layer, because the magnitudes of a stress applied to the two resin layers are different from each other, the module 100 tends to warp easily. Therefore, as a resin of the first resin layer 106 thinner than the second resin layer 103, the resin having a larger linear expansion coefficient than a resin of the second resin layer 103 is adopted. As a result, a stress balance can be maintained, and therefore, the warpage of the module 100 can be reduced.

Patent Document 1: International Publication No. WO 2014/017159 (see paragraphs 0033 to 0048, FIG. 4, etc.)

BRIEF SUMMARY OF THE DISCLOSURE

However, in a manufacturing process of the module 100, it is important to grind the semiconductor substrate 104 in the thickness direction with high accuracy, and the grinding needs to be performed with the thickness variation factor eliminated as much as possible. Therefore, the grinding of the semiconductor substrate 104 is performed in a state in which only the first resin layer 106 is formed and before the second resin layer 103 is formed. At this time, because the resin having a large linear expansion coefficient is used for the first resin layer 106, a semi-finished product in which only the first resin layer 106 is formed has a large warpage. In particular, when the module 100 is manufactured in a collective board, the warpage tends to become large because the area is large. The warpage of the collective board adversely affects the grinding accuracy of the semiconductor substrate 104. Further, the semiconductor substrate 104 is ground and thinned to be reduced in rigidity. However, because the linear expansion coefficient of the semiconductor substrate 104 is smaller than that of the resin, the problem occurs that the stress due to the difference in linear expansion coefficient between the semiconductor substrate 104 and the first resin layer 106 becomes large, and the semiconductor substrate 104 is easily damaged.

The present disclosure has been made in view of the above problem, and it is an object of the present disclosure to provide a high frequency module in which, in a state of the component being exposed from a sealing resin layer, the sealing resin layer is used whose linear expansion coefficient is small, and whose glass transition temperature is high and/or elastic modulus is large, in order to reduce the warpage of a semi-finished product and prevent the damage to the component coated with the sealing resin layer.

In order to achieve the above object, the high frequency module of the present disclosure includes: a wiring board; a first component mounted on one main surface of the wiring board; a first sealing resin layer having a contact surface that comes into contact with the one main surface of the wiring board, an opposing surface that opposes the contact surface, and a side surface that connects end edges of the contact surface and the opposing surface to each other, and sealing the first component; a second component mounted on another main surface of the wiring board; a second sealing resin layer having a contact surface that comes into contact with the other main surface of the wiring board, an opposing surface that opposes the contact surface, and a side surface that connects end edges of the contact surface and the opposing surface to each other, and sealing the second component. The first component is at least partially exposed from the opposing surface of the first sealing resin layer, the first sealing resin layer has a linear expansion coefficient of a resin smaller than a linear expansion coefficient of a resin of the second sealing resin layer, and the first sealing resin layer has a glass transition temperature of the resin higher than a glass transition temperature of the resin of the second sealing resin layer and/or the first sealing resin layer has an elastic modulus of the resin larger than an elastic modulus of the resin of the second sealing resin layer.

According to this configuration, because the warpage of the semi-finished product after the first sealing resin layer is formed can be reduced, the grinding process of the first component can be facilitated and the grinding accuracy can be improved. Further, by using the resin having a small linear expansion coefficient for the first sealing resin layer, the difference in linear expansion coefficient between the first component whose rigidity is reduced by grinding and the first sealing resin layer is reduced, and therefore, the stress due to the difference in linear expansion coefficient can be reduced, and the damage to the first component can be prevented.

Further, the first component may be a semiconductor device. In this case, because the first component can be ground together with the first sealing resin layer, the height of the high frequency module can be reduced.

The height from the one main surface of the wiring board to the opposing surface of the first sealing resin layer may be lower than the height from the other main surface of the wiring board to the opposing surface of the second sealing resin layer. In this case, the warpage caused by the stress due to the difference in thickness between the first sealing resin layer and the second sealing resin layer can be prevented.

Further, the high frequency module may further include a connection terminal embedded in the first sealing resin layer, and in the connection terminal, one end may be connected to the one main surface of the wiring board and another end may be exposed from the opposing surface of the first sealing resin layer. With this configuration, the module can be connected to the outside by the connection terminal. Further, when the other end of the connection terminal is connected to a mother board, the heat generated in the first component can be released through a ground electrode of the mother board.

Further, the connection terminal may be a bump.

The high frequency module may further include a shield film that coats at least the side surface of the first sealing resin layer, a side surface of the wiring board, and the side surface and the opposing surface of the second sealing resin layer. In this case, the shielding performance for the first component and the second component can be improved.

According to the present disclosure, because the warpage of the semi-finished product after the first sealing resin layer is formed can be reduced, the grinding process of the first component can be facilitated, and the grinding accuracy of the first component can be improved. Further, because the resin having a small linear expansion coefficient is used for the first sealing resin layer, the stress due to the difference in linear expansion coefficient between the first component and the first sealing resin layer can be reduced and the first component can be prevented from being damaged.

BRIEF DESCRIPTION OF THE SEVERAL VIEWS OF DRAWINGS

DETAILED DESCRIPTION OF THE DISCLOSURE

First Embodiment

The configuration of a high frequency module 1a according to a first embodiment of the present disclosure is described with reference to FIGS. 1 to 5C. Note that FIG. 1 is a sectional view of the high frequency module 1a, FIG. 2 is a plan view showing a lower surface 5a of a first sealing resin layer 5 of the high frequency module 1a, FIGS. 3A and 3B are graphs showing relationships between a glass transition temperature, and a linear expansion coefficient and an elastic modulus, and FIGS. 4A to 4D and 5A to 5C are views showing a manufacturing process of the high frequency module 1a.

Figure 1:
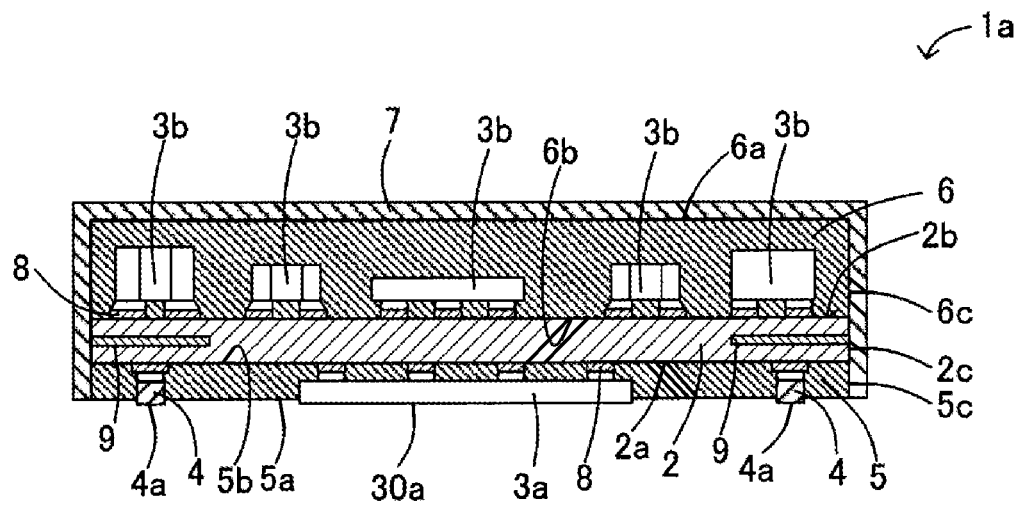
FIG. 1 is a sectional view of a high frequency module according to a first embodiment of the present disclosure.
Figure 2:
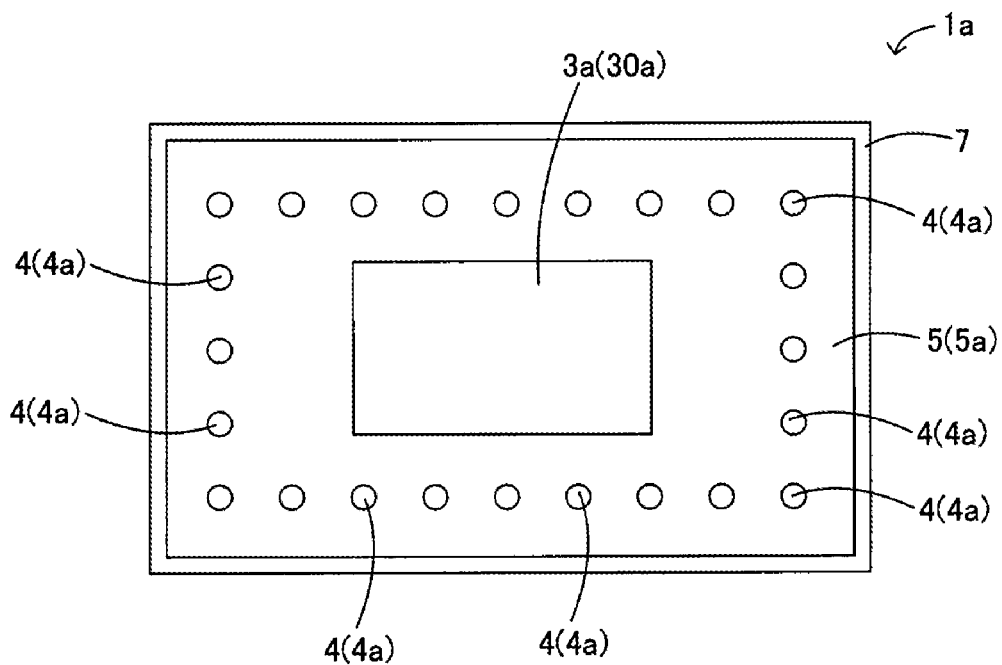
FIG. 2 is a plan view of the high frequency module shown in FIG. 1.
Figure 3A:
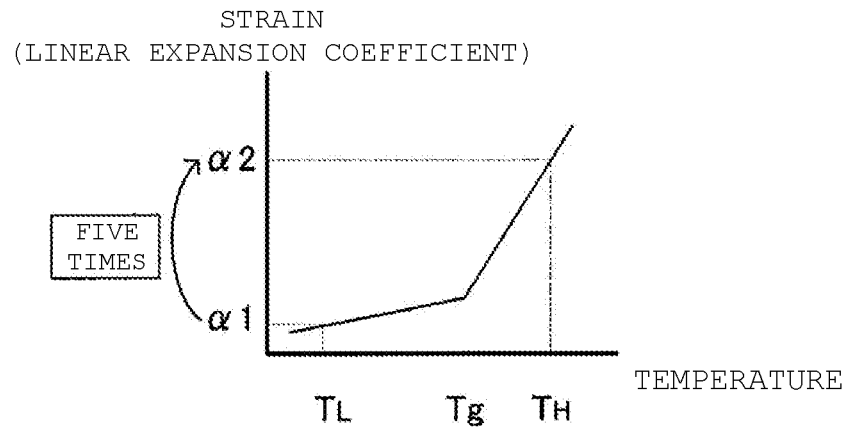
FIGS. 3A and 3B are graphs showing relationships between a glass transition temperature, and a linear expansion coefficient (strain) and an elastic modulus.
Figure 3B:
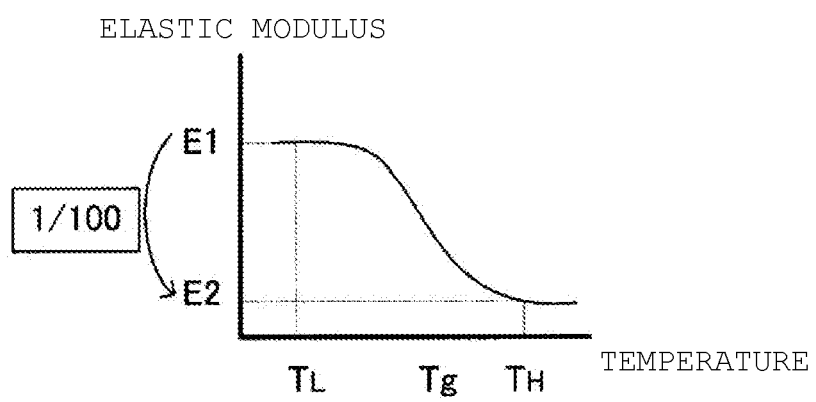

As shown in FIGS. 1 and 2, the high frequency module 1a according to this embodiment includes a wiring board 2, a first component 3a and a plurality of connection terminals 4 mounted on a lower surface 2a of the wiring board 2, a first sealing resin layer 5 that seals the first component 3a and the connection terminals 4, a plurality of second components 3b mounted on an upper surface 2b of the wiring board 2, a second sealing resin layer 6 that seals the second components 3b, a shield film 7 that coats a side surface 5c of the first sealing resin layer 5, a side surface 6c and an upper surface 6a of the second sealing resin layer 6, and a side surface 2c of the wiring board 2. The high frequency module is mounted on a mother board or the like of an electronic device in which high frequency signals are used.

The wiring board 2 is formed by laminating a plurality of insulating layers formed of, for example, low temperature co-fired ceramics, high temperature co-fired ceramics, a glass epoxy resin, or others. The upper surface 2b (corresponding to "the other main surface" of the present disclosure) and the lower surface 2a (corresponding to "one main surface" of the present disclosure) of the wiring board 2 are formed with mounting electrodes 8 for mounting the respective components 3a, 3b or the connection terminals 4. Further, the plurality of connection terminals 4 for external connection are mounted on the lower surface 2a. Further, various internal wiring electrodes (not shown) and ground electrodes 9 are formed between the adjacent insulating layers. Furthermore, a plurality of via conductors (not shown) for connecting the internal wiring electrodes are formed inside the wiring board 2. The mounting electrodes 8 and the internal wiring electrodes are both formed of metal such as Cu, Ag, or Al, which is generally used as a wiring electrode. In addition, each via conductor is formed of metal such as Ag or Cu. Note that each mounting electrode 8 may be Ni/Au plated.

The first component 3a is constituted of a semiconductor device such as an integrated circuit (IC) or a power amplifier (PA), and is mounted on the wiring board 2 by a general surface mounting technique such as solder joining. Further, in order to reduce the height of the high frequency module 1a, a lower surface 30a of the first component 3a is ground together with the lower surface 5a of the first sealing resin layer 5, and the lower surface 30a of the first component 3a is exposed from the lower surface 5a of the first sealing resin layer 5. The first component 3a is ground after being mounted on the lower surface 2a of the wiring board 2.

The second components 3b are constituted of chip components such as a chip inductor, a chip capacitor, and a chip resistor, and a semiconductor device such as an IC.

The connection terminals 4 are used for input/output with an external board and are arranged along the outer periphery of the high frequency module 1a as shown in FIG. 2. In this embodiment, the connection terminals 4 are arranged in one row along the outer periphery of the high frequency module 1a, but may be arranged in parallel in a plurality of rows depending on the location. Further, the connection terminal 4 may be formed by, for example, mounting a metal pin on the mounting electrode 8 and solder joining the same, or may be a post electrode formed in advance on the mounting electrode 8 by plating. Further, the connection terminal 4 may be a bump. A metal coating may be formed on a lower surface 4a of the connection terminal 4 by plating.

The first sealing resin layer 5 and the second sealing resin layer 6 are formed of a resin generally adopted as a sealing resin such as an epoxy resin containing a silica filler, and seal the first component 3a and the second components 3b, respectively. The first sealing resin layer 5 has an upper surface 5b (corresponding to the "contact surface of the sealing resin layer" of the present disclosure) that comes into contact with the lower surface 2a of the wiring board 2, the lower surface 5a (corresponding to the "opposing surface of the sealing resin layer" of the present disclosure) that opposes the upper surface 5b, and the side surface 5c. Similarly, the second sealing resin layer 6 has a lower surface 6b that comes into contact with the upper surface 2b of the wiring board 2, the upper surface 6a that opposes the lower surface 6b, and the side surface 6c. Further, the height of the first sealing resin layer 5 from the lower surface 2a of the wiring board 2 is made lower than the height of the second sealing resin layer 6 from the upper surface 2b of the wiring board 2. Further, in order to increase the thermal conductivity, a filler having a high thermal conductivity such as an alumina filler may be used.

In order to change the values of the linear expansion coefficient, the glass transition temperature, and the elastic modulus, the first sealing resin layer 5 and the second sealing resin layer 6 have different resin material constants and filler contents, and the resins of the sealing resin layers 5, 6 are selected so as to satisfy the following two conditions. The first condition is that the linear expansion coefficient of the resin of the first sealing resin layer 5 is smaller than the linear expansion coefficient of the resin of the second sealing resin layer 6; and the second condition is that the glass transition temperature of the resin of the first sealing resin layer is higher than the glass transition temperature of the resin of the second sealing resin layer, and/or the elastic modulus of the resin of the first sealing resin layer is larger than the elastic modulus of the second sealing resin layer. By using the resins that satisfy the above conditions, the grinding can be accurately performed to expose the lower surface 30a of the first component 3a which is a semiconductor device, and further, the warpage of the high frequency module 1a generated due to the difference in thickness between the first sealing resin layer 5 and the second sealing resin layer 6 can be mitigated.

Now, the explanation is made of a reason that the warpage can be mitigated by making the linear expansion coefficient larger in the resin of the second sealing resin layer 6 than in the resin of the first sealing resin layer, although the stress on the high frequency module 1a increases.

As shown in the graph of strain temperature characteristics in FIG. 3A, when a linear expansion coefficient $\alpha 1$ at a temperature $T_L$ (low temperature) lower than a glass transition temperature $T_g$ is compared with a linear expansion coefficient $\alpha 2$ at a temperature $T_H$ (high temperature) higher than the glass transition temperature $T_g$, the linear expansion coefficient becomes about five times with the glass transition temperature $T_g$ as a turning point. That is, the linear expansion coefficient $\alpha 2$ is about five times as high as the linear expansion coefficient $\alpha 1$. Further, as shown in the graph of elastic modulus temperature characteristics of FIG. 3B, when an elastic modulus E1 at the temperature $T_L$ (low temperature) lower than the glass transition temperature $T_g$ is compared with an elastic modulus E2 at the temperature $T_H$ (high temperature) higher than the glass transition temperature, the elastic modulus becomes about one hundredth with the glass transition temperature $T_g$ as a turning point. That is, the elastic modulus E2 is about one hundredth of the elastic modulus E1.

On the other hand, in the resin, the stress σ is related to the linear expansion coefficients $\alpha 1$, $\alpha 2$ and the elastic moduli E1, E2 by Formula (1) of Mathematical formula 1. As described above, when an amount of change from the linear expansion coefficient $\alpha 1$ to the linear expansion coefficient $\alpha 2$ is compared with an amount of change from the elastic modulus E1 to the elastic modulus E2, because the amount of change in the elastic modulus is larger, a degree of influence of the second term of the Formula (1) of Mathematical formula 1 on the stress σ is higher. Accordingly, in the resin, the relationship between the stress σ, and the linear expansion coefficients $\alpha 1$, $\alpha 2$ and the elastic moduli E1, E2 of the resin can be simplified as shown by Formula (2) of Mathematical formula 1. Note that according to Formula (2) of Mathematical formula 1, the lower the glass transition temperature $T_g$, the smaller the temperature fluctuation range, and the smaller the cumulative value of the stress σ due to the temperature fluctuation. Further, the lower the elastic modulus E1, the smaller the stress σ. Therefore, the stress increased by making the linear expansion coefficient of the resin of the second sealing resin layer 6 larger than that of the resin of the first sealing resin layer can be reduced by lowering the glass transition temperature $T_g$ of the resin of the second sealing resin layer 6, and by lowering the elastic modulus E1 of the resin of the second sealing resin layer 6. Both the glass transition temperature $T_g$ and the elastic modulus E1 may be reduced, or either one may be reduced.

[Mathematical formula 1]

$$\sigma \propto \int_{T_g}^{T_H} E2 \cdot \alpha 2 \, dT + \int_{T_L}^{T_g} E1 \cdot \alpha 1 \, dt \tag{1}$$

$$\sigma \propto \int_{T_L}^{T_g} E1 \cdot \alpha 1 \, dT \tag{2}$$

The shield film 7 coats the side surface 5c of the first sealing resin layer 5, the side surface 6c and the upper surface 6a of the second sealing resin layer 6, and the side surface 2c of the wiring board 2. Further, the shield film 7 is connected to the ground electrodes 9 exposed on the side surface 2c of the wiring board 2.

The shield film 7 can be formed in a multilayer structure having a close contact film laminated on the side surface 5c of the first sealing resin layer 5, the side surface 2c of the wiring board 2, and the side surface 6c and the upper surface 6a of the second sealing resin layer 6, a conductive film laminated on the close contact film, and a rust preventive film laminated on the conductive film. Here, the close contact film is provided to enhance the close contact strength between the conductive film and both of the sealing resin layers 5, 6, and can be formed of a material that forms a passive state, such as Ti, Cr, or stainless steel (SUS). Further, the conductive film is a layer having a substantial shield function of the shield film 7, and can be formed of, for example, any metal among Cu, Ag, and Al. The rust preventive film is provided to prevent the conductive film from being corroded or scratched, and can be formed of, for example, SUS.

(Manufacturing Method of High Frequency Module)

Next, a manufacturing method of the high frequency module 1a is described with reference to FIGS. 4A to 4D and 5A to 5C. In the first embodiment, the high frequency module 1a is manufactured by forming a collection of a plurality of high frequency modules 1a and then dividing the collection into individual pieces. Note that the order of the steps may be changed or new steps may be added, as necessary.

Figure 4A:
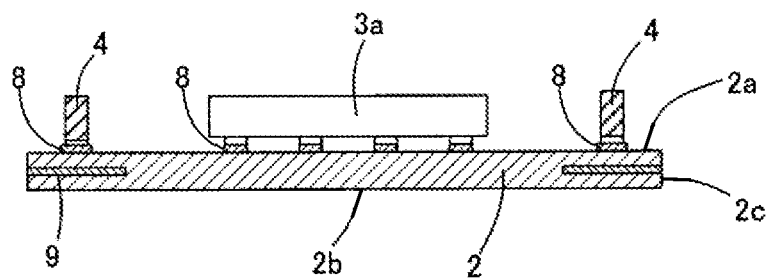
FIGS. 4A to 4D are views showing a manufacturing process of the high frequency module in FIG. 1.
Figure 4B:
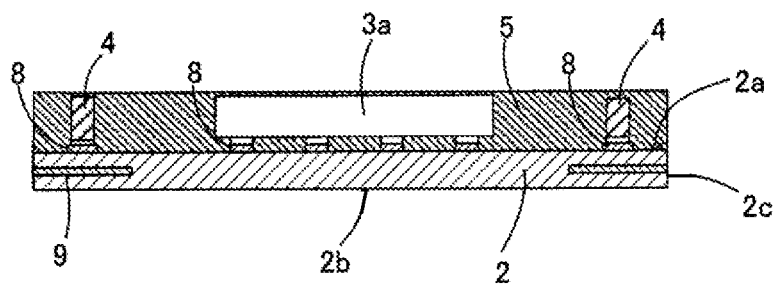

First, as shown in FIG. 4A, the first component 3a is mounted on the lower surface 2a of the wiring board 2 using a known surface mounting technique, and the connection terminals 4 are formed. Each of the connection terminal 4 may be formed by mounting a metal pin on the mounting electrode 8 and solder joining the same, or may be formed in advance on the mounting electrode 8 by plating. Thereafter, as shown in FIG. 4B, the first sealing resin layer 5 is formed so as to coat the first component 3a and the connection terminals 4. At this time, the first sealing resin layer 5 is formed of a resin having the linear expansion coefficient smaller than that of the second sealing resin layer 6. The linear expansion coefficient of the first sealing resin layer 5 can be adjusted, for example, by increasing the content of silica filler. The first sealing resin layer 5 can be formed by using a known technique such as the transfer molding process, the compression molding process, or the resin dispensing process. For the first sealing resin layer 5, a general epoxy resin containing silica filler can be used. Further, in order to give the first sealing resin layer 5 high thermal conductivity, an epoxy resin can be used which contains a filler having a high thermal conductivity such as an alumina filler.

Figure 4C:
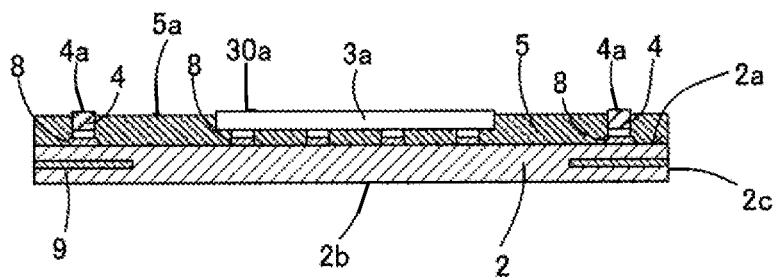

After the first sealing resin layer 5 is formed, as shown in FIG. 4C, the lower surface 30a of the first component 3a and the lower surfaces 4a of the connection terminals 4 are exposed by grinding and the like. After the grinding, metal films are formed on the lower surfaces 4a of the connection terminals 4 such as by plating. Before the plating process, a surface treatment such as etching may be performed. As described above, when the grinding is performed in a state in which the first sealing resin layer is formed before the second sealing resin layer 6 is formed, the grinding accuracy of the first component 3a can be improved. However, in the collective board as a semi-finished product after the first sealing resin layer 5 is formed, the warpage tends to occur easily. In this embodiment, because the resin of the first sealing resin layer 5 having a small linear expansion coefficient is adopted, the warpage of the collective board as the semi-finished product can be suppressed, and the manufacturing becomes easy. Further, by forming the first sealing resin layer 5 using the resin having a small linear expansion coefficient, the difference in linear expansion coefficient between the first component 3a and the first sealing resin layer 5 becomes small, and accordingly, the stress due to the difference between the linear expansion coefficients can be reduced and the damage to the first component 3a can be prevented.

Figure 4D:
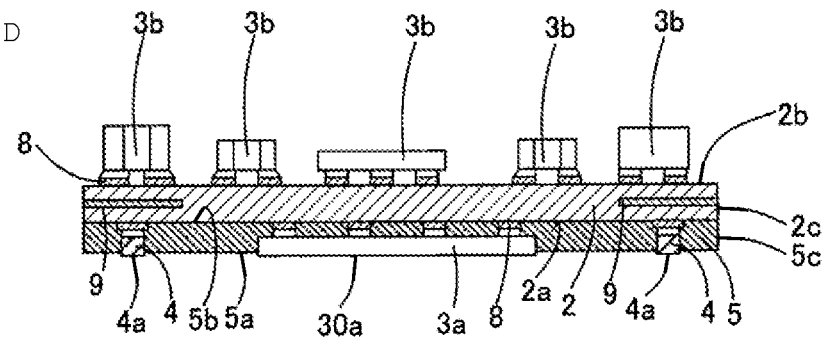
Figure 5A:
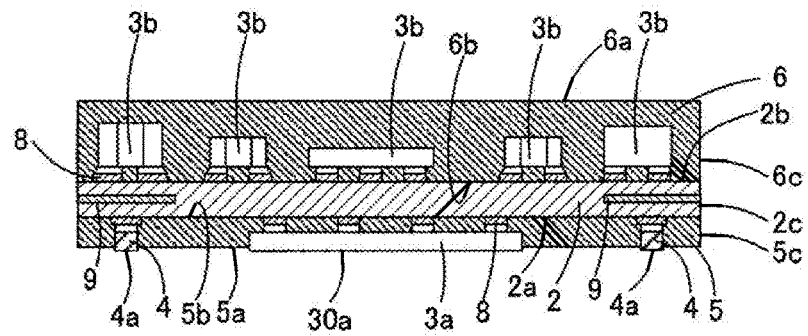
FIGS. 5A to 5C are views showing the manufacturing process of the high frequency module in FIG. 1.

Thereafter, as shown in FIG. 4D, the second components 3b are mounted on the upper surface 2b of the wiring board 2 by using a known mounting technique. Next, as shown in FIG. 5A, the second sealing resin layer 6 is formed so as to coat the second components 3b. As with the first sealing resin layer 5, the second sealing resin layer 6 can be formed by using a known technique such as the transfer molding process, the compression molding process, or the resin dispensing process. Further, for the second sealing resin layer 6, a general epoxy resin containing silica filler can be used. Further, in order to give the first sealing resin layer 5 high thermal conductivity, an epoxy resin can be used which contains a filler having a high thermal conductivity such as an alumina filler. After the second sealing resin layer 6 is formed, the second sealing resin layer 6 may be ground from the upper surface 6a side in order to reduce the product thickness of the high frequency module 1a.

Figure 5B:
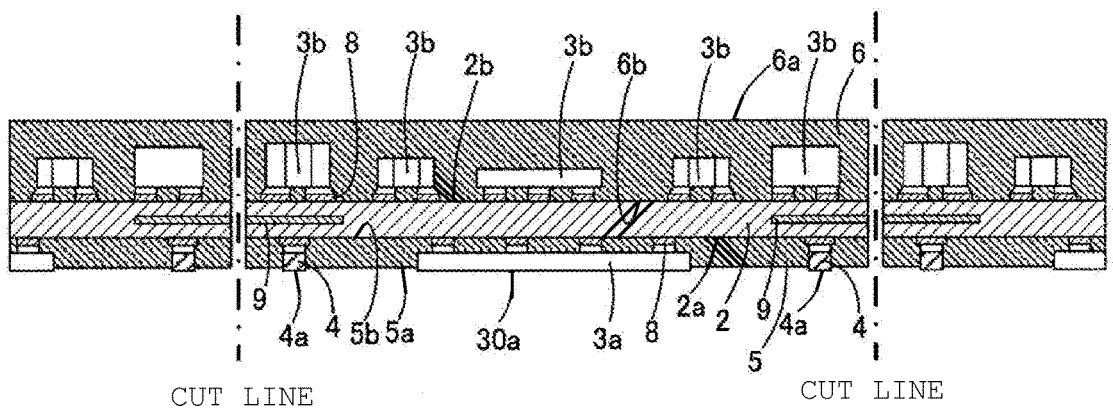
Figure 5C:
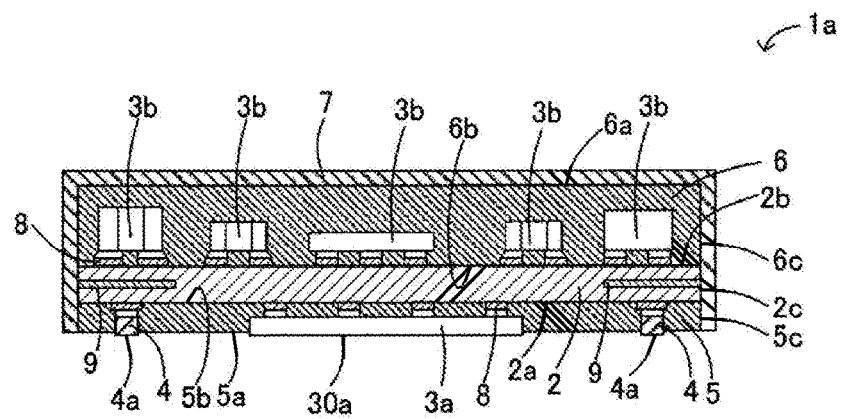

Next, as shown in FIG. 5B, the high frequency module 1a manufactured as the collective board is cut into pieces with a dicing machine or by laser processing. Further, as shown in FIG. 5C, the shield film 7 is formed on the side surface 2c of the wiring board 2, the side surface 5c of the first sealing resin layer 5, and the side surface 6c and the upper surface 6a of the second sealing resin layer 6. The shield film 7 can be formed by a known method such as sputtering, vacuum deposition, plating, or application of a conductive resin. Further, before the shield film 7 is formed, a step of removing residual components by a dry process such as plasma cleaning, dry etching, or ion milling may be added.

Therefore, according to the above-described embodiment, by reducing the linear expansion coefficient of the resin of the first sealing resin layer 5 formed first, the warpage can be reduced in the collective board as the semi-finished product after the first sealing resin layer 5 is formed, and accordingly, the manufacturing becomes easy and the grinding accuracy of the first component 3a can be improved. Further, the linear expansion coefficient of the first component 3a is 2.4 to 6 ppm/° C., which is smaller than that of the resin material, but by reducing the linear expansion coefficient of the first sealing resin layer 5 as in the above-described embodiment, the difference in linear expansion coefficient between the first component 3a and the first sealing resin layer 5 can be reduced, and accordingly, the stress due to the difference in linear expansion coefficient can be reduced.

In addition, when the linear expansion coefficient of the resin of the first sealing resin layer 5 is reduced due to the stress caused by the difference in thickness between the first sealing resin layer 5 and the second sealing resin layer 6, the warpage of the high frequency module 1a may become large, but by adjusting the glass transition temperature and the elastic modulus of the resin of the first sealing resin layer 5 and the second sealing resin layer 6, the high frequency module 1a can be provided in which the warpage does not easily occur.

Second Embodiment

Figure 6:
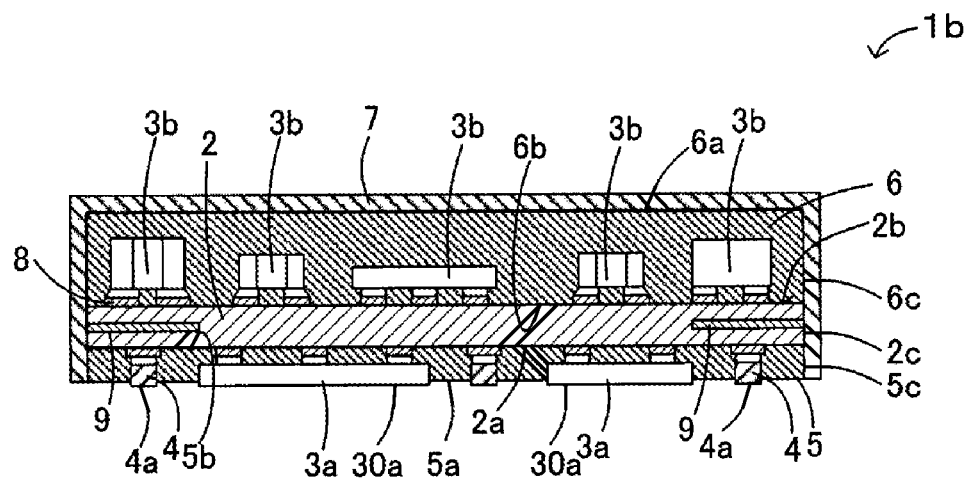
FIG. 6 is a sectional view of a high frequency module according to a second embodiment of the present disclosure.

A high frequency module 1b according to a second embodiment of the present disclosure is described with reference to FIGS. 6 and 7. FIG. 6 is a cross-sectional view of the high frequency module 1b, and FIG. 7 is a plan view showing a lower surface 5a of a first sealing resin layer 5 of the high frequency module 1b.

Figure 7:
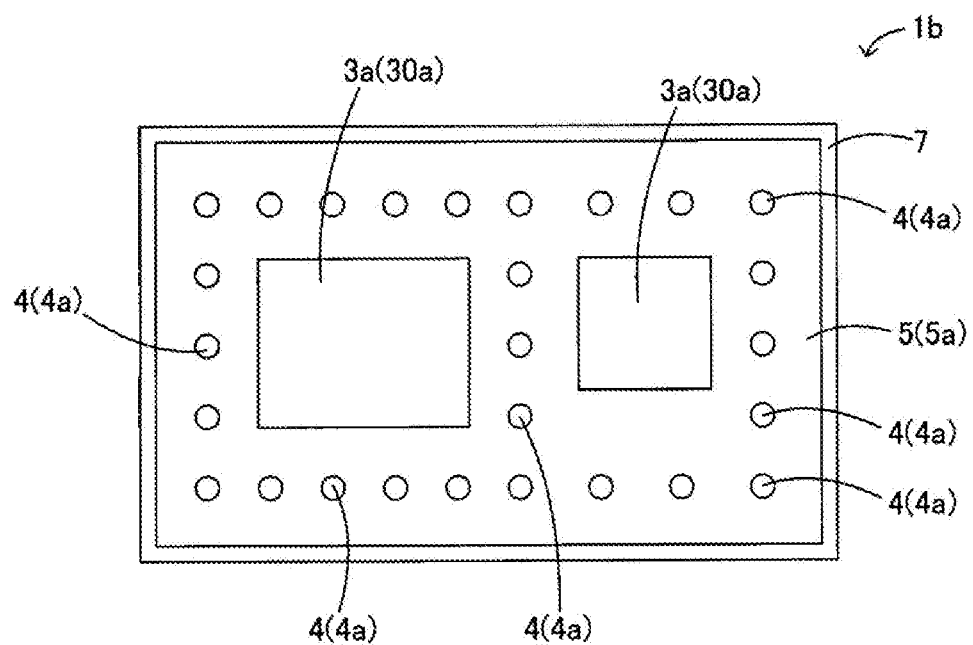
FIG. 7 is a plan view of the high frequency module shown in FIG. 6.

The high frequency module 1b according to this embodiment is different from the high frequency module 1a of the first embodiment described with reference to FIGS. 1 and 2 in that, as shown in FIGS. 6 and 7, a plurality of first components 3a are mounted on a lower surface 2a of a wiring board 2 and connection terminals 4 are arranged between the adjacent first components 3a. Other configurations are the same as those of the high frequency module 1a according to the first embodiment, and therefore, the same reference numerals are given and the descriptions thereof are omitted.

In this embodiment, the two first components 3a are mounted on the lower surface 2a of the wiring board 2. Further, the connection terminals 4 are arranged not only at portions along the outer periphery of the high frequency module 1b but also at a portion sandwiched by the two first components 3a. The number of the first components 3a mounted on the lower surface 2a of the wiring board 2 may be three or more, and the connection terminals 4 may be arranged in a plurality of rows.

According to this configuration, in addition to the effect similar to that of the high frequency module 1a of the first embodiment, the larger number of the first components 3a can be mounted on the high frequency module 1b, and therefore, the high frequency module 1b can be highly functionalized.

Third Embodiment

Figure 8:
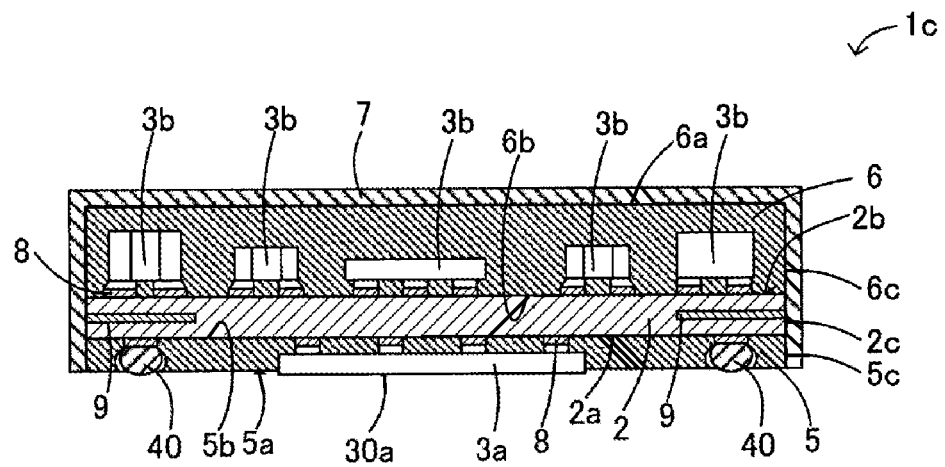
FIG. 8 is a sectional view of a high frequency module according to a third embodiment of the present disclosure.

A high frequency module 1c according to a third embodiment of the present disclosure is described with reference to FIGS. 8 and 9. FIG. 8 is a sectional view of the high frequency module 1c, and FIG. 9 is a plan view showing a lower surface 5a of a first sealing resin layer 5 of the high frequency module 1c.

Figure 9:
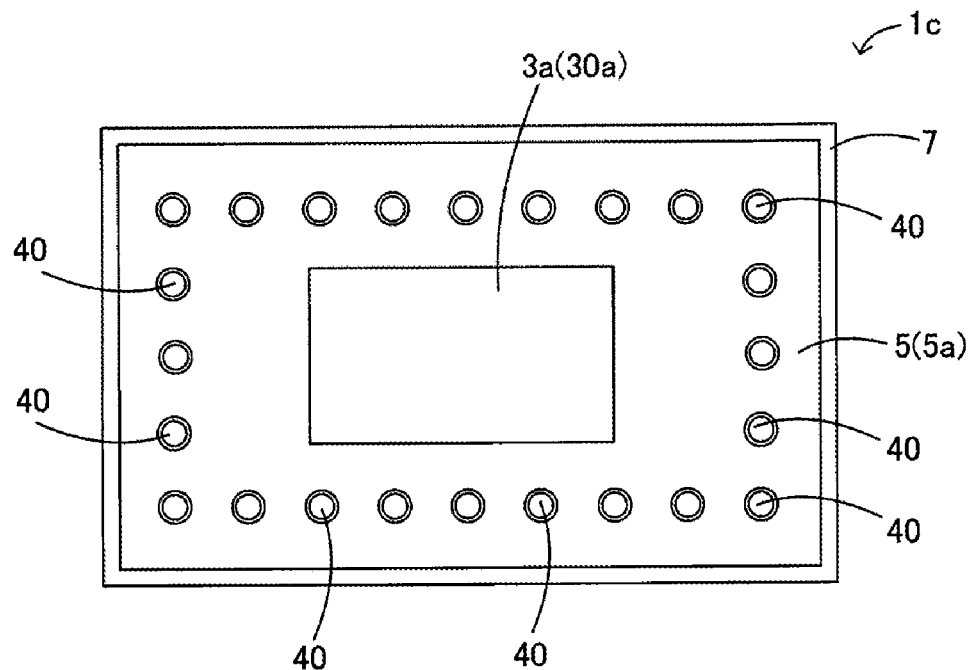
FIG. 9 is a plan view of the high frequency module shown in FIG. 8.
Figure 10:
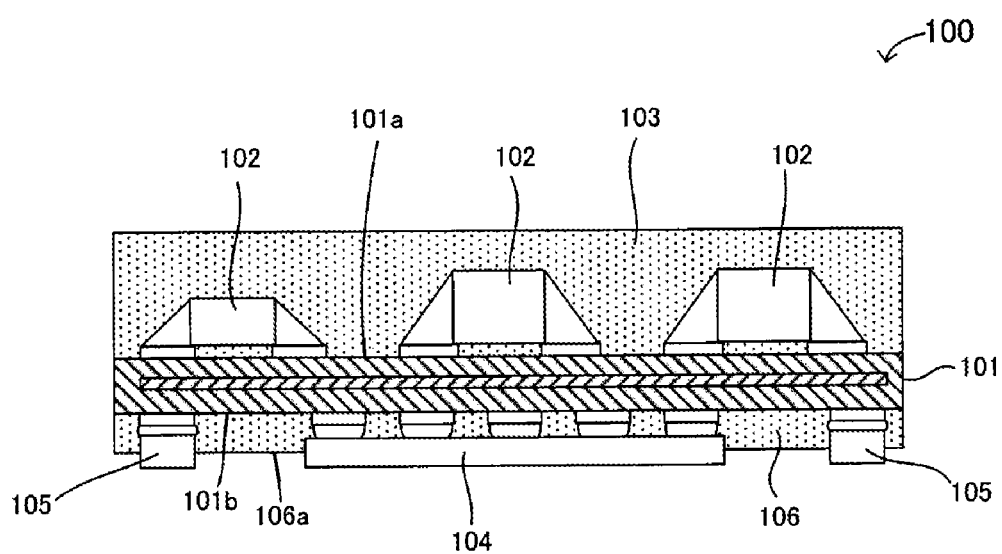
FIG. 10 is a sectional view of a conventional high frequency module.

The high frequency module 1c according to this embodiment is different from the high frequency module 1a of the first embodiment described with reference to FIGS. 1 and 2 in that, as shown in FIGS. 8 and 9, a plurality of connection terminals 40 for external connection are formed as bumps. Other configurations are the same as those of the high frequency module 1a according to the first embodiment, and therefore, the same reference numerals are given and the descriptions thereof are omitted.

In this embodiment, each of the connection terminals 40 is formed as a bump such as a solder bump or a gold bump on the mounting electrode 8. The connection terminals 40 are used for the input/output with an external board and are arranged along the outer periphery of the high frequency module 1c as shown in FIG. 9. In this embodiment, the connection terminals 40 are arranged in one row along the outer periphery of the high frequency module 1c, but the connection terminals 40 may be arranged in parallel in a plurality of rows depending on the location.

The present disclosure is not limited to the above-described embodiments, and various modifications other than those described above can be made without departing from the spirit of the disclosure. For example, the configurations of the above-described embodiments and modifications may be combined.

For example, the second components 3b and other components may be mounted on the lower surface 2a of the wiring board 2. At this time, the height of the second components 3b or other components mounted on the lower surface 2a of the wiring board 2 is preferably lower than the height of the first sealing resin layer 5 after grinding.

Further, the shield film 7 may not be formed. In this case, the ground electrodes 9 may not be exposed from the side surface 2c of the wiring board 2.

The present disclosure can be applied to various high frequency modules including semiconductor components.

1a, 1b, 1c: High frequency module
2: Wiring board
3a: First component
3b: Second component
5: First sealing resin layer
6: Second sealing resin layer

The invention claimed is:

1. A high frequency module comprising:
a wiring board;
a first component mounted on one main surface of the wiring board;
a first sealing resin layer having a contact surface, an opposing surface, and a side surface, and sealing the first component, wherein the contact surface of the first sealing resin layer comes into contact with the one main surface of the wiring board, the opposing surface of the first sealing resin layer opposes the contact surface of the first sealing resin layer, and the side surface of the first sealing resin layer connects end edges of the contact surface of the first sealing resin layer and the opposing surface of the first sealing resin layer to each other;
a second component mounted on another main surface of the wiring board; and
a second sealing resin layer having a contact surface, an opposing surface, and a side surface, and sealing the second component, wherein the contact surface of the second sealing resin layer comes into contact with the other main surface of the wiring board, the opposing surface of the second sealing resin layer opposes the contact surface of the second sealing resin layer, and the side surface of the second sealing resin layer connects end edges of the contact surface of the second sealing resin layer and the opposing surface of the second sealing resin layer to each other,
wherein the first component is at least partially exposed from the opposing surface of the first sealing resin layer,
wherein the first sealing resin layer has a linear expansion coefficient smaller than a linear expansion coefficient of the second sealing resin layer, and
wherein the first sealing resin layer has a glass transition temperature higher than a glass transition temperature of the second sealing resin layer and/or the first sealing resin layer has an elastic modulus larger than an elastic modulus of the second sealing resin layer.

2. The high frequency module according to claim 1, wherein the first component is a semiconductor device.

3. The high frequency module according to claim 1, wherein a height from the one main surface of the wiring board to the opposing surface of the first sealing resin layer is lower than a height of the second sealing resin layer from the other main surface of the wiring board to the opposing surface of the second sealing resin layer.

4. The high frequency module according to claim 1, further comprising a connection terminal embedded in the first sealing resin layer,
wherein the connection terminal has one end connected to the one main surface of the wiring board and another end exposed from the opposing surface of the first sealing resin layer.

5. The high frequency module according to claim 4, wherein the connection terminal is a bump.

6. The high frequency module according to claim 1, further comprising a shield film coating at least the side surface of the first sealing resin layer, a side surface of the wiring board, and the side surface and the opposing surface of the second sealing resin layer.

7. The high frequency module according to claim 2, wherein a height from the one main surface of the wiring board to the opposing surface of the first sealing resin layer is lower than a height of the second sealing resin layer from the other main surface of the wiring board to the opposing surface of the second sealing resin layer.

8. The high frequency module according to claim 2, further comprising a connection terminal embedded in the first sealing resin layer,
wherein the connection terminal has one end connected to the one main surface of the wiring board and another end exposed from the opposing surface of the first sealing resin layer.

9. The high frequency module according to claim 3, further comprising a connection terminal embedded in the first sealing resin layer,
wherein the connection terminal has one end connected to the one main surface of the wiring board and another end exposed from the opposing surface of the first sealing resin layer.

10. The high frequency module according to claim 2, further comprising a shield film coating at least the side surface of the first sealing resin layer, a side surface of the wiring board, and the side surface and the opposing surface of the second sealing resin layer.

11. The high frequency module according to claim 3, further comprising a shield film coating at least the side surface of the first sealing resin layer, a side surface of the wiring board, and the side surface and the opposing surface of the second sealing resin layer.

12. The high frequency module according to claim 4, further comprising a shield film coating at least the side surface of the first sealing resin layer, a side surface of the wiring board, and the side surface and the opposing surface of the second sealing resin layer.

13. The high frequency module according to claim 5, further comprising a shield film coating at least the side surface of the first sealing resin layer, a side surface of the wiring board, and the side surface and the opposing surface of the second sealing resin layer.

* * * * *